US012805001B2

(12) United States Patent
Choppalli et al.

(10) Patent No.: US 12,805,001 B2
(45) Date of Patent: Nov. 17, 2026

(54) THREE DIMENSIONAL SERPENTINE RESISTOR

(71) Applicant: GLOBALFOUNDRIES U.S. Inc., Malta, NY (US)

(72) Inventors: Vvss Satyasuresh Choppalli, Bangalore (IN); Anupam Dutta, West Bengal (IN); Rui Tze Toh, Singapore (SG); Varuna Anantha Padmanabha Baipadi, Bengaluru (IN); Praveen Paul A, Bengaluru (IN); Ananth Sundaram, Bengaluru (IN); Muhammed Shafi Kunnathodi, Malappuram (IN)

(73) Assignee: GLOBALFOUNDRIES U.S. INC., Malta, NY (US)

(*) Notice: Subject to any disclaimer, the term of this patent is extended or adjusted under 35 U.S.C. 154(b) by 360 days.

(21) Appl. No.: 18/402,208

(22) Filed: Jan. 2, 2024

(65) Prior Publication Data

US 2025/0221013 A1 Jul. 3, 2025

(51) Int. Cl.
*H10D 84/00* (2025.01)
*H10D 1/47* (2025.01)
*H10D 88/00* (2025.01)

(52) U.S. Cl.
CPC ........... *H10D 84/209* (2025.01); *H10D 1/474* (2025.01); *H10D 88/00* (2025.01)

(58) Field of Classification Search
None
See application file for complete search history.

(56) References Cited

U.S. PATENT DOCUMENTS

| | | | | |
|---|---|---|---|---|
| 5,352,923 | A | 10/1994 | Boyd et al. | |
| 5,466,963 | A | 11/1995 | Beasom | |
| 6,291,305 | B1 | 9/2001 | Huang et al. | |
| 7,084,483 | B2 | 8/2006 | Aitken et al. | |
| 7,902,629 | B2 | 3/2011 | Chinthakindi et al. | |
| 8,110,862 | B2 | 2/2012 | Cheng et al. | |
| 9,385,177 | B2 | 7/2016 | Zhang et al. | |
| 10,573,711 | B2 | 2/2020 | Daigle et al. | |
| 11,444,149 | B1 | 9/2022 | Adusumilli et al. | |
| 2010/0072574 | A1* | 3/2010 | Ohshima ............. | H10W 20/498 257/E29.325 |

* cited by examiner

*Primary Examiner* — Hung K Vu

(57) ABSTRACT

A serpentine resistor within a back end of line (BEOL) level of a substrate includes a plurality of first sections oriented in a first horizontal direction, at least one second section oriented in a second horizontal direction, a plurality of vertical sections, and at least one lateral turn between the first horizontal direction and the second horizontal direction. The serpentine resistor may have a serpentine shape in the vertical plane and the horizontal plane, and may extend between two bonded substrates, providing higher resistance values compared to conventional BEOL resistors.

18 Claims, 5 Drawing Sheets

THREE DIMENSIONAL SERPENTINE RESISTOR

BACKGROUND

Resistors are widely used in integrated circuits (ICs) and can be fabricated during back end of the line (BEOL) processing. Resistors manufactured within BEOL layers can provide high resistance without sacrificing valuable space occupied by active circuitry in a front end of line (FEOL) portion of the IC. FEOL resistors are typically diffusion resistors which are formed within a substrate, and have parasitic capacitance caused by the reverse-biased junction formed between the diffusion resistor and the opposing doping of the substrate.

BEOL resistors typically have less parasitic capacitive coupling to the semiconductor substrate than resistors formed in the front end. As the demand for higher degrees of integration in ICs increases, there is a need for BEOL resistors that provide high levels of resistance in a compact form.

SUMMARY

Embodiments of the present application relate to integrated circuits (ICs), and more specifically, to a back end of line (BEOL) serpentine resistor with a three-dimensional configuration. The serpentine resistor may have vertical and horizontal elements and turns in both the vertical and lateral directions. The resistor may be implemented on a single substrate, or on two bonded substrates.

In an embodiment, a resistor includes a plurality of first sections oriented in a first horizontal direction, at least one second section oriented in a second horizontal direction, and a plurality of vertical sections, and the resistor includes at least one lateral turn between the first horizontal direction and the second horizontal direction.

In an embodiment, a semiconductor substrate has a serpentine resistor within a BEOL level of the substrate, the serpentine resistor including a plurality of first sections oriented in a first horizontal direction, at least one second section oriented in a second horizontal direction, and a plurality of vertical sections, and the serpentine resistor includes at least one lateral turn between the first horizontal direction and the second horizontal direction.

In an embodiment, a method for forming a serpentine resistor includes forming a plurality of first sections oriented in a first horizontal direction, forming at least one second section oriented in a second horizontal direction, and forming a plurality of vertical sections, and the serpentine resistor includes at least one lateral turn between the first horizontal direction and the second horizontal direction.

DETAILED DESCRIPTION

Embodiments of the present application relate to a serpentine resistor with a three-dimensional configuration. The serpentine resistor may be implemented in a single substrate or across two bonded substrates.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured. The figures are not drawn to scale, and some features are intentionally enlarged or diminished for emphasis and visual clarity.

Figure 1:
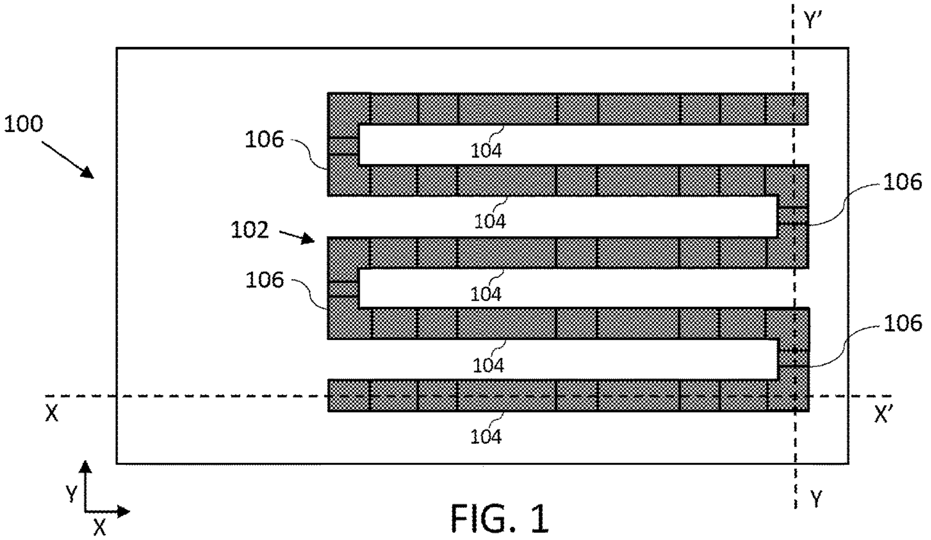
FIG. 1 illustrates an integrated circuit with a serpentine resistor according to an embodiment.

FIG. 1 is a layout diagram of an integrated circuit 100 including a serpentine resistor 102. As seen in FIG. 1, the serpentine resistor 102 has a serpentine shape in a horizontal plane (plane X-Y) of the integrated circuit 100. The serpentine shape in the horizontal plane can be characterized as having a set of parallel long segments 104 interconnected with a set of short segments 106. The long segments 104 are oriented in a first horizontal direction corresponding to the X axis in FIG. 1, and the short segments 106 are oriented in a second horizontal direction corresponding to the Y axis.

In the embodiment of FIG. 1, each of the long segments 104 have the same length and each of the short segments 106 have the same length resulting in a serpentine pattern with a regular shape. In other embodiments, at least a portion of the serpentine resistor 102 has a regular shape in a horizontal plane, while other portions such as terminal ends of the resistor may have a shape with different length segments. A serpentine resistor 102 may have two or more portions each of which has a distinct regular shape in which the long segments 104 and short segments 106 have the same respective lengths, for example to accommodate other structures in the integrated circuit. In addition, the final legs of the serpentine resistor 102 may have different lengths to couple with a contact or via at a specific location of the integrated circuit 100.

In the embodiment shown in FIG. 1, the long segments 104 are linear and orthogonal to the short segments 106, but other embodiments are possible. For example, the long segments 104 may include one or more non-linear part to conform to or avoid other structures in the integrated circuit 100, and the short segments 104 may have a non-linear shape such as a semi-circular shape.

Figure 2:
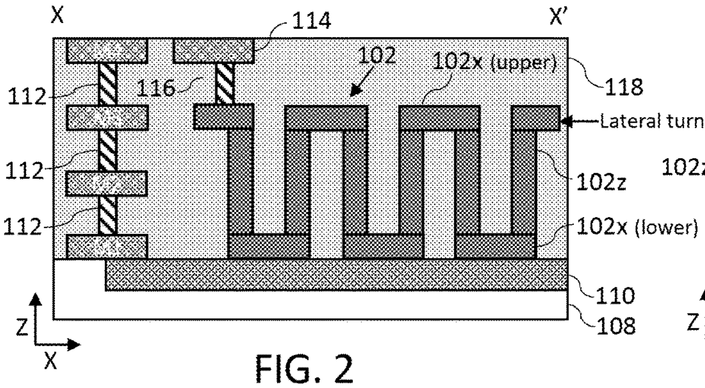
FIG. 2 illustrates a cross-sectional view taken along X-X' of the integrated circuit of FIG. 1.
Figure 3:
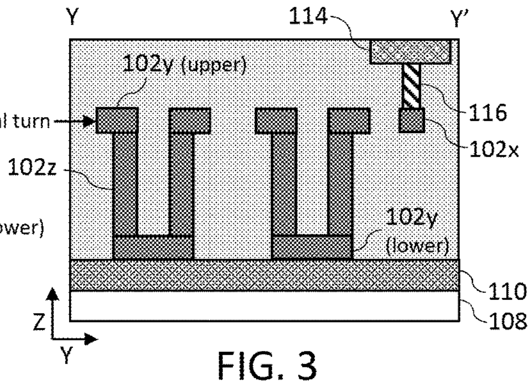
FIG. 3 illustrates a cross-sectional view taken along Y-Y' of the integrated circuit of FIG. 1.

FIG. 2 is cross-sectional view taken along line X-X' of the integrated circuit 100, and FIG. 3 is a cross-sectional view taken along line Y-Y' of the integrated circuit 100. The cross-sections in FIG. 2 and FIG. 3 show features of the serpentine resistor 102 in the vertical direction, or Z axis.

In the embodiment of FIGS. 2 and 3, the serpentine resistor 102 is formed over a device region 110 of a semiconductor substrate 108. The device region 110 or active region includes active components or circuits, such as conductive features, implantation regions, resistors, capacitors, and other semiconductor elements, e.g., transistors, diodes, etc. The device region 110 is formed over the bulk substrate 108 in a front-end-of-line (FEOL) process in some embodiments. The semiconductor substrate 108 may comprise silicon, silicon germanium, silicon carbide, etc. as the semiconductor material. In an embodiment, the semiconductor substrate 108 is a silicon on insulator (SOI) substrate.

Also shown in FIG. 2 is a set of metal lines M1-M4, each corresponding to a BEOL metal layer. Each of the metal lines M1-M4 is coupled to a vertically adjacent metal line by a via 112, which may be Interlayer dielectric vias (IDV) or Interconnect Vias (IV). Vias 112 are formed by etching via holes using conventional mask patterning and etch processes as known in the art and depositing a conductive material in the via holes. The conductive material may be copper.

While the serpentine resistor 102 of FIGS. 2 and 3 extends along three metal layers M1, M2 and M3 in the vertical direction, the serpentine resistor 102 may extend along greater or fewer metal layers in other embodiments. For example, the serpentine resistor 102 may extend along at least two metal layers, at least three metal layers, at least four metal layers, or at least five metal layers in the vertical direction.

In addition, the specific metal layers may be different in other embodiments. For example, the base of the serpentine resistor 102 may be at metal layer M2, metal layer M4, etc. Accordingly, the serpentine resistor 102 may have a different height and be located at a different vertical level than the embodiment illustrated by FIGS. 2 and 3.

Terminal ends of the serpentine resistor 102 are coupled to metal lines 114 by conductive interconnect structures 116. In various embodiments, the interconnect structures 116 may be contact plugs, IDVs or IVs. The metal lines 114 and interconnect structures 116 may include conductive materials typically used in BEOL processes, such as Cu, Al, W, Ti, TiN, Ta, TaN, or multiple layers or combinations thereof.

The conductive structures are surrounded by an insulating material 118 which is a dielectric material. In some embodiments, the insulating material 118 is made of silicon oxide, although other materials are possible. In some embodiments, the insulating material 118 includes multiple dielectric layers of dielectric materials. One or more of the multiple dielectric layers may be made of low dielectric constant (low-k) materials.

The serpentine resistor 102 comprises a plurality of first horizontal sections 102*x* oriented in a first horizontal direction, which is the x-axis of FIGS. 1-3, a plurality of second horizontal sections 102*y* oriented in a second horizontal direction, which is the y-axis, and a plurality of vertical sections 102*z* that are oriented in a vertical direction, which is the z-axis. As seen in FIG. 2, vertical sections 102*z* are coupled to respective upper and lower first horizontal sections 102*x*, while FIG. 3 shows that other vertical sections 102*z* are coupled to respective upper and lower second horizontal sections 102*y*.

In each of the long segments 104, the serpentine resistor 102 includes a plurality of vertical sections 102*z* interconnected with a plurality of first horizontal sections 102*x*. The plurality of first horizontal sections 102*x* include lower sections that connect the bases of adjacent vertical sections 102*z* and upper sections that connect the tops of adjacent vertical sections 102*z*. In combination, the lower horizontal sections 102*x*, vertical sections 102*z* and upper horizontal sections 102*x* form a serpentine shape in the vertical X-Z plane. The serpentine shape can be characterized as a series of U-shaped resistor elements that are linked together by upper horizontal sections 102*x*, or a series of inverted U-shaped elements that are linked together by lower horizontal sections 102*x*.

Although the serpentine shape in FIG. 2 is a regular shape, in other embodiments, one or more of the horizontal sections 102*x* has a different length from other horizontal sections 102*x*. Similarly, the vertical sections 102*z* are not limited to having the same height across the entire serpentine resistor 102.

Turning to FIG. 3, in the Y-Z plane, the serpentine resistor 102 includes pairs of vertical sections 102*z* which are coupled to one another by lower second horizontal sections 102*y*. Both pairs of vertical sections 102*z* interconnected by second horizontal sections 102*y* have an inverted U-shape in which the second horizontal sections 102*y* are lower sections that extend between bases of adjacent vertical sections 102*z*. In another embodiment, one or more of the second horizontal sections 102*y* may extend between tops of the vertical sections 102*z* in a similar fashion to the upper horizontal sections 102*x* shown in FIG. 2.

The upper first horizontal section 102*x* on the far-right side of FIG. 2 has a shorter length than the first horizontal sections 102*x* coupled between adjacent vertical sections 102*z* and contacts the upper second horizontal section 102*y* on the far-left side of FIG. 3 to form a lateral turn. An example of a lateral turn with this configuration is shown in an isometric view in FIG. 6. The lateral turns are present at the transitions between the long segments 104 and the short segments 106 illustrated in FIG. 1. Considering the lateral turns shown in the horizontal plane of FIG. 1 and the U-shaped turns in the vertical planes of FIGS. 2 and 3, the serpentine resistor 102 has a serpentine shape in all three of the X, Y and Z dimensions.

The first horizontal sections 102*x* which form the terminal ends of the serpentine resistor 102 in FIGS. 2 and 3 are coupled to metal lines 114 by interconnect structures 116. Thus, one end of the serpentine resistor 102 is coupled to a first metal line 114 by a first interconnect structure 116, and the other end of the serpentine resistor 102 is coupled to a second metal line 114 by a second interconnect structure 116. In various embodiments, the interconnect structures 116 may be coupled to upper first horizontal sections 102*x* as shown in the figures, lower first horizontal sections 102*x*, second horizontal sections 102*y*, or vertical sections 102*z*. When the interconnect structures 116 are coupled to vertical sections 102*z*, an intermediary structure such as a landing pad may be present.

Figure 4A:
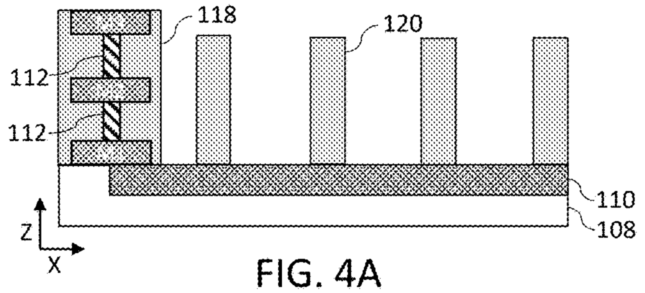
FIGS. 4A to 4C and 5A to 5C illustrate process steps for forming the serpentine resistor according to the embodiment of FIG. 1.
Figure 5A:
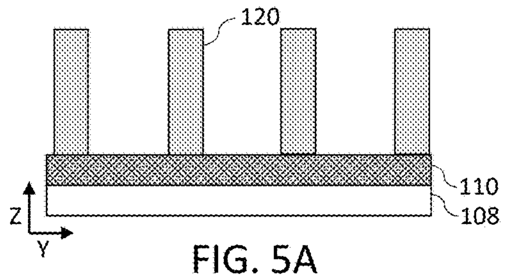

A process for manufacturing a serpentine resistor 102 will now be explained with respect to FIGS. 4A-4C and 5A-5C. As seen in FIGS. 4A and 5A, after forming metal layers M1 and M2, insulating material 118, which may be an interlayer dielectric (ILD) material, is etched using an etch mask to form a pattern of pillars 120.

Figure 4B:
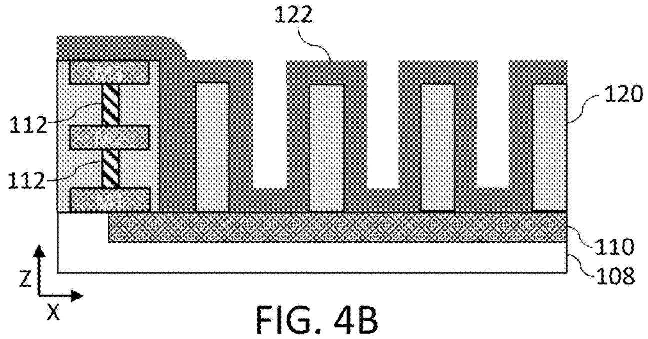
Figure 5B:
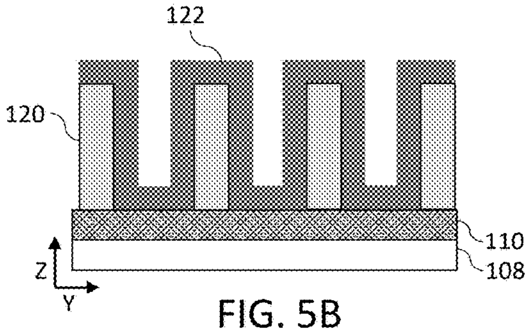
Figure 4C:
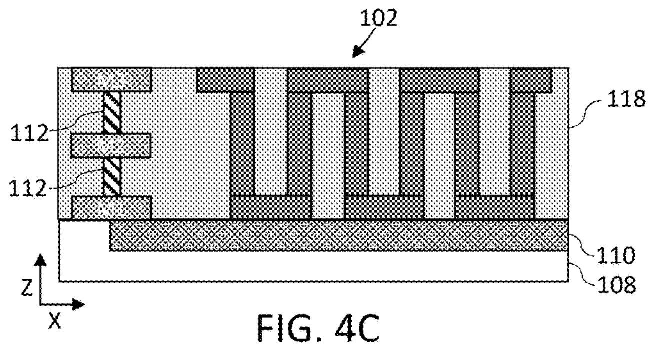
Figure 5C:
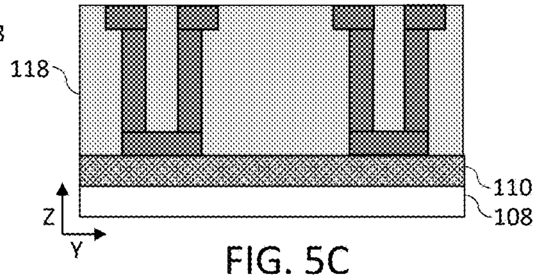

A layer of BEOL resistor material 122 is then deposited over the pillar pattern as seen in FIGS. 4B and 5B. The resistor material 122 may be, for example, polysilicon or a metal material such as tantalum nitride or silicon chromium. When the resistor material 122 is polysilicon, it may be formed using a chemical vapor deposition (CVD) process, while metal materials may be formed using physical vapor deposition (PVD). The resistor material 122 is patterned as seen in FIGS. 4C and 5C to form the serpentine shaped resistor 102 that extends over and between pillars 120. After etching, the lines of serpentine resistor 102 may have a thickness of from 30 to 250 nm, and a width of about 500 nm in a non-limiting example. The precise width and thickness of the serpentine resistor may vary between embodiments based on the target resistance, materials and processes used to form the resistor.

Figure 6:
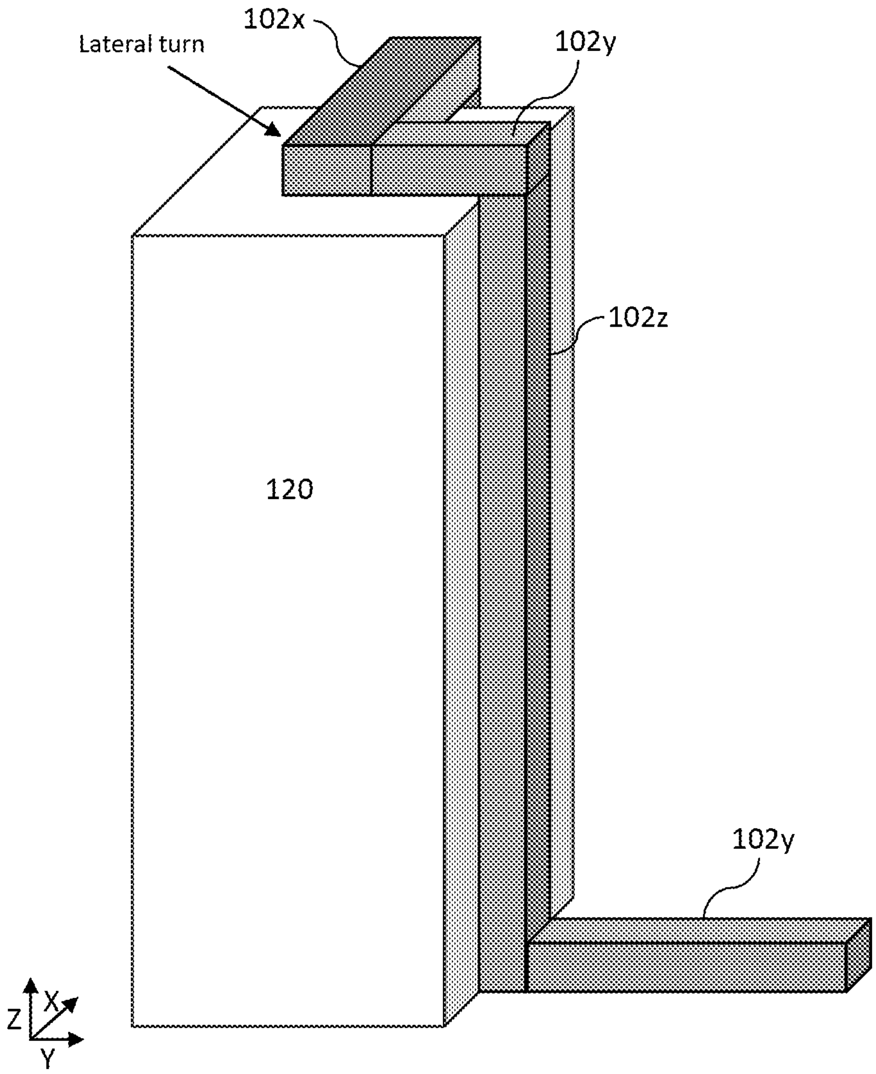
FIG. 6 illustrates an example of a lateral turn of a serpentine resistor within a substrate.

An example of one of the pillars 120 at a lateral turn of the serpentine resistor 102 after the etching step of FIGS. 4C and 5C is illustrated in FIG. 6. As seen in FIG. 6, the lateral turn includes a junction between a first horizontal section 102*x* and a second horizontal section 102*y* on a top of the pillar 120. Similar junctions may be present at each transition of the serpentine resistor 102 between long segments 104 and short segments 106. In another embodiment, the lateral turn may occur at a base level, e.g. in a space between two pillars 120.

Returning to FIGS. 4C and 5C, after etching the serpentine resistor 102, metal lines of metal layer M3 are formed over the substrate by conventional deposition and etching processes, and insulation material 118 is deposited over the substrate to fill spaces in the U-shaped turns of the serpentine resistor 102. In some embodiments, metal lines of metal layer M3 are formed in the insulation material 118 using a damascene process. A series of deposition and etching processes are subsequently performed as known in the art to form interconnect structures 116, metal lines 114, vias 112 and metal lines of subsequent metal layers (e.g. metal layers M4-Mn), as shown in the structures of FIGS. 2 and 3.

Figure 7:
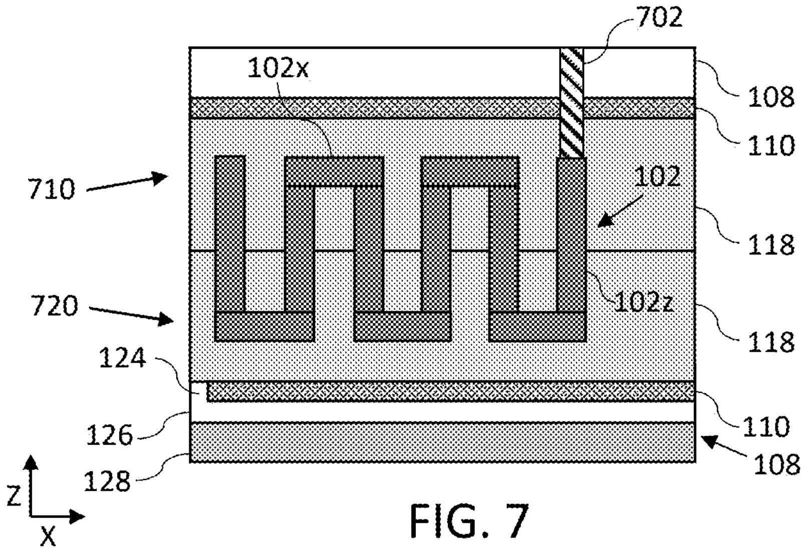
FIG. 7 illustrates an embodiment of a serpentine resistor that extends between two bonded substrates.

FIG. 7 illustrates a second embodiment of a serpentine resistor 102 that extends between a first substrate 710 and a second substrate 720 that is bonded to the first substrate. The serpentine resistor 102 of the second embodiment may include a similar arrangement of first horizontal sections 102*x*, second horizontal sections 102*y*, and vertical sections 102*z* as the embodiments described above with respect to FIGS. 1-3. In particular, the serpentine resistor 102 of the second embodiment of FIG. 7 may have a serpentine shape in both the horizontal dimension and the vertical dimension, including a plurality of interconnected U-shapes in a vertical plane of a long segment 104 and lateral turns at transitions between long segments 104 and short segments 106. Also shown in FIG. 7 are elements of the substrate 108 including a shallow trench isolation (STI) structure 124 and a buried oxide layer 126 formed over a bulk semiconductor substrate material 128. These same structures may be present in the first embodiment as well.

Because the serpentine resistor 102 of the second embodiment extends across two substrates, its dimensions may be substantially larger than the first embodiment. For example, the height of the vertical sections 102*z* may be several microns, e.g. from 3 to 15 microns or greater depending on the thickness of the insulation layers 118 of the substrates. The width and thickness of the resistor lines may be on the order of hundreds of nanometers, e.g. from 200 to 1000 nm, and adjacent vertical segments 102*z* may be spaced apart by a distance of from 0.5 microns to 1.5 microns, for example. Of course, other dimensions are possible.

One difference between the second embodiment and the first embodiment is that in the second embodiment, an end of the serpentine resistor 102 is coupled to a terminal 702. The terminal 702 may be a TSV including a contact pad, bump or similar electrode on a backside surface of the semiconductor substrate 108 for connecting to an external device. Another potential difference is that lateral turns may be simplified compared to the first embodiment.

Figure 8:
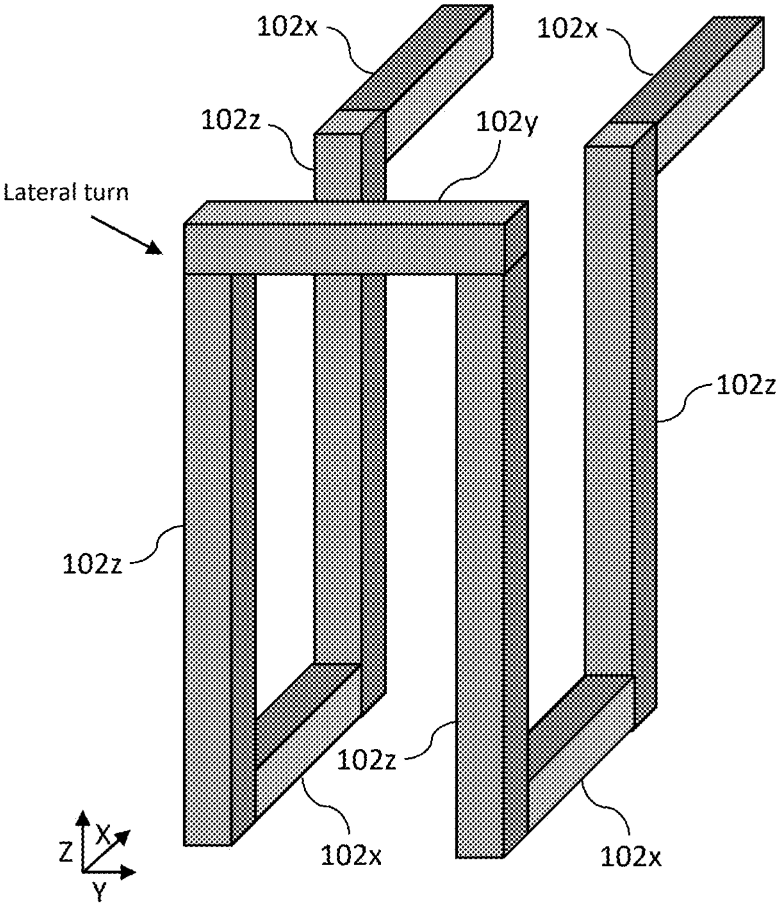
FIG. 8 illustrates an example of a lateral turn of a serpentine resistor that extends between two bonded substrates.

An example of an embodiment of a lateral turn in the second embodiment is illustrated in FIG. 8. The transition between the X direction and Y direction is facilitated by a vertical section 102*z*, a lower end of which is coupled to a first horizontal section 102*x* oriented in the X-direction and an upper end of which is coupled to a second horizontal section 102*y* oriented in the Y-direction. In another embodiment, the positions of the horizontal sections may be reversed, e.g. the first horizontal section 102*x* is coupled to the top of the vertical section 102*z* and the second horizontal section 102*y* is coupled to the bottom of the vertical section 102*z* at the lateral turn. Other embodiments are possible, including a semicircular element connecting two long segments 106.

Figure 9A:
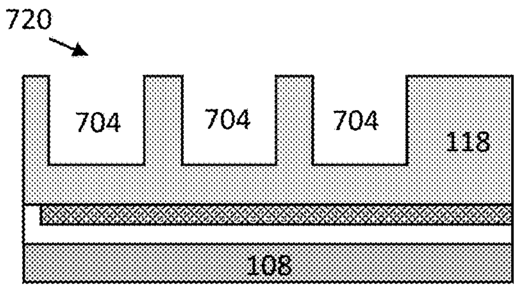
FIGS. 9A to 9C and 10A to 10C illustrate a process for forming the serpentine resistor according to the embodiment of FIG. 7.
Figure 10A:
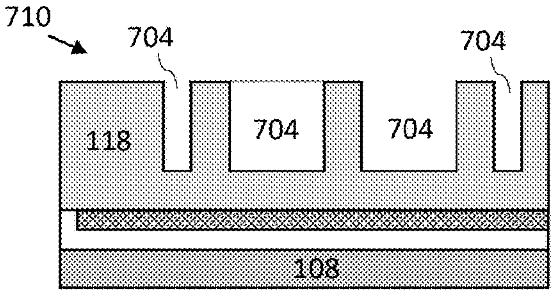

FIGS. 8A-8C and 9A-9C show process steps of an embodiment of forming the second embodiment of the serpentine resistor of FIG. 7. As seen in FIGS. 9A and 10A, after the active structures and metal layers of a substrate are formed, a pattern of trenches 704 is etched into the insulation material 118 (e.g. ILD). A BEOL resistor material such as polysilicon, tantalum nitride or silicon chromium is deposited in the trenches 704. Insulation material 118 is deposited to fill the remaining space in the trenches, and a planarization process such as a chemical mechanical polishing (CMP) process is performed to form the structures shown in FIGS. 9B and 10B. In some embodiments, a separate planarization process is performed to remove resistor material before depositing the insulation material in the trenches.

Figure 9B:
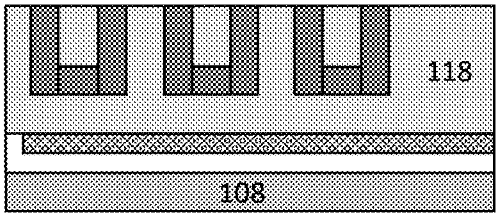
Figure 10B:
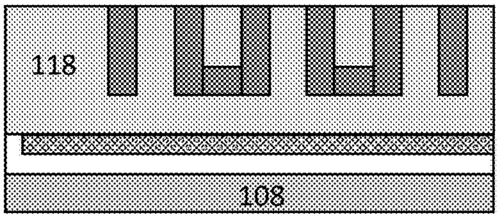
Figure 9C:
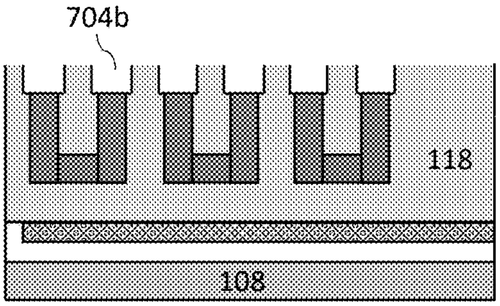
Figure 10C:
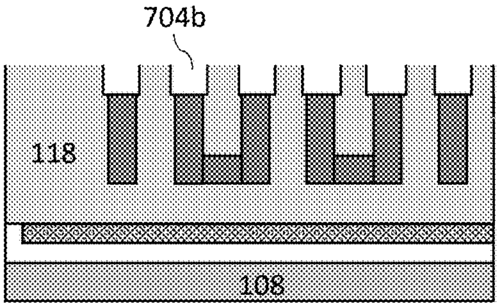

In an optional embodiment, as seen in FIGS. 9C and 10C, additional processes may be performed to increase the surface area of the serpentine resistor 102 that is exposed on the surface of the first and second substrates 710 and 720. In this embodiment, a set of enlarged trenches 704*b* is formed over the surfaces of the resistor material exposed on the surface of the substrates as shown in FIGS. 9B and 10B. The enlarged trenches 704*b* may be formed, for example, by depositing and planarizing an additional layer of insulator material 118 over the substrates, forming an etch pattern, and using the etch pattern to form the enlarged trenches. Subsequently, the enlarged trenches 704*b* are filled by depositing and planarizing an additional layer of resistor material to form a level bonding surface.

After filling the enlarged trenches 704*b* or after finishing the structures shown in FIGS. 9B and 10B, the faces of substrates 710 and 720 are placed against one another and bonded. The bonding may be performed using any known or future developed bonding process. For example, the bonding surfaces or faces of the substrates may be thoroughly cleaned to remove all contamination. The face of the first substrate 710 may be aligned with and placed into contact with the face of second substrate 720 to form a bond between dielectric layers 118 at the dielectric-to-dielectric interface, and the substrates may be heated to form a strong bond. When the resistor material includes a metal material, the metal material may be recessed by a few angstroms before bonding to facilitate a hybrid bond. After bonding, one or more terminal 702 is formed using etching and deposition processes as known in the art.

A device with a serpentine resistor 102 according to embodiments of the present disclosure has superior properties compared to conventional BEOL resistors. For example, due at least in part to the three-dimensional serpentine configuration of the resistor 102, much higher levels of resistance can be achieved compared to one or two-dimensional resistors while maintaining similar or lower parasitic capacitance.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A resistor comprising:

a plurality of long segments, each long segment comprising:

a plurality of lower first sections oriented in a first horizontal direction;

a plurality of upper first sections oriented in the first horizontal direction; and a plurality of vertical sections respectively coupled between the plurality of lower first sections and the plurality of upper first sections, a plurality of short segments, each short segment comprising at least one second section oriented in a second horizontal direction; and a plurality of lateral turns between respective long segments of the plurality of long segments and short segments of the plurality of short segments, wherein each of the lower first sections, the upper first sections, the vertical sections and the at least one second section comprise a resistor material.

2. The resistor of claim 1, wherein the resistor material includes polysilicon, tantalum nitride or silicon chromium.

3. The resistor of claim 1, wherein the vertical sections extend along at least three back end of line (BEOL) metal layers in a vertical direction.

4. The resistor of claim 1, wherein the first horizontal direction is orthogonal to the second horizontal direction.

5. The resistor of claim 1, wherein the vertical sections include a first portion in a first semiconductor device and a second portion in a second semiconductor device.

6. The resistor of claim 5, wherein the first semiconductor device is face bonded to the second semiconductor device.

7. The resistor of claim 6, wherein a lateral turn of the lateral turns includes a first junction between one of the upper or lower first sections and a first vertical section of the vertical sections, and a second junction between a second section of the at least one second section and the first vertical section.

8. The resistor of claim 5, wherein the upper first sections are in a BEOL level of the first semiconductor device and the lower first sections are in a BEOL level of the second semiconductor device.

9. The resistor of claim 1, wherein a lateral turn of the lateral turns includes a junction between one of the upper and lower first sections and a second section of the at least one second section.

10. The resistor of claim 1, wherein some of the vertical sections are only coupled to the first sections and other vertical sections are coupled to the first sections and second sections of the at least one second section.

11. The resistor of claim 1, wherein the resistor has a serpentine shape in a vertical plane and a horizontal plane.

12. An integrated circuit including a serpentine resistor within a BEOL portion of the integrated circuit, the serpentine resistor comprising:

a plurality of long segments, each long segment comprising:

a plurality of lower first sections oriented in a first horizontal direction;

a plurality of upper first sections oriented in the first horizontal direction; and a plurality of vertical sections respectively coupled between the plurality of lower first sections and the plurality of upper first sections, at least one short segment comprising at least one second section oriented in a second horizontal direction; and at least one lateral turn between a long segment of the plurality of long segments and the at least one short segment, wherein each of the lower first sections, upper first sections, vertical sections and at least one second section comprise a resistor material.

13. The integrated circuit of claim 12, wherein the resistor material includes polysilicon, tantalum nitride or silicon chromium.

14. The integrated circuit of claim 12, wherein the vertical sections extend along at least three BEOL metal layers in a vertical direction.

15. The integrated circuit of claim 12, wherein the first horizontal direction is orthogonal to the second horizontal direction.

16. The integrated circuit of claim 12, wherein a lateral turn of the at least one lateral turn includes a junction between one of the upper or lower first sections and a second section of the at least one second section.

17. The integrated circuit of claim 12, wherein the integrated circuit is face bonded to a second integrated circuit and a second portion of the serpentine resistor is within a BEOL level of the second integrated circuit.

18. The integrated circuit of claim 12, wherein the serpentine resistor has a serpentine shape in a vertical plane and a horizontal plane.

* * * * *